(12) United States Patent
Li et al.

(10) Patent No.: US 11,855,160 B2
(45) Date of Patent: Dec. 26, 2023

(54) THIN FILM TRANSISTOR STRUCTURE, GOA CIRCUIT, AND DISPLAY DEVICE

(71) Applicant: Shenzhen China Star Optoelectronics Semiconductor Display Technology Co., Ltd., Shenzhen (CN)

(72) Inventors: Gongtan Li, Shenzhen (CN); Hyunsik Seo, Shenzhen (CN)

(73) Assignee: Shenzhen China Star Optoelectronics Semiconductor Display Technology Co., Ltd., Shenzhen (CN)

(*) Notice: Subject to any disclaimer, the term of this patent is extended or adjusted under 35 U.S.C. 154(b) by 0 days.

(21) Appl. No.: 16/625,904

(22) PCT Filed: Nov. 27, 2019

(86) PCT No.: PCT/CN2019/121282
§ 371 (c)(1),
(2) Date: Dec. 23, 2019

(87) PCT Pub. No.: WO2021/082150
PCT Pub. Date: May 6, 2021

(65) Prior Publication Data
US 2022/0416033 A1 Dec. 29, 2022

(30) Foreign Application Priority Data
Nov. 1, 2019 (CN) .......................... 201911060470.6

(51) Int. Cl.
*H01L 29/417* (2006.01)
*G02F 1/1345* (2006.01)
(Continued)

(52) U.S. Cl.
CPC ...... *H01L 29/41733* (2013.01); *G02F 1/1368* (2013.01); *G02F 1/13454* (2013.01);
(Continued)

(58) Field of Classification Search
CPC ........... H01L 29/41733; H01L 27/1222; H01L 29/78696; H01L 27/1237; G02F 1/13454; G09G 2300/0408
See application file for complete search history.

(56) References Cited

U.S. PATENT DOCUMENTS

| | | |
|---|---|---|
| 4,949,139 A | 8/1990 | Korsh |
| 2003/0141500 A1 | 7/2003 | Amundson et al. |

(Continued)

FOREIGN PATENT DOCUMENTS

| | | |
|---|---|---|
| CN | 101217154 A * | 7/2008 |
| CN | 102569415 A | 7/2012 |

(Continued)

*Primary Examiner* — Peter M Albrecht
(74) *Attorney, Agent, or Firm* — PV IP PC; Wei Te Chung; Zhigang Ma

(57) ABSTRACT

A thin film transistor structure, a gate driver on array (GOA) circuit and a display device are provided. The thin film transistor structure defines a plurality of thin film transistors by patterning an active layer. Therefore, when a defect appears in the gate insulating layer of one of the plurality of thin film transistors and a leakage path is formed, other thin film transistors will not be affected. Therefore, a problem of functional failure of a whole thin film transistor structure can be avoided.

20 Claims, 4 Drawing Sheets

(51) Int. Cl.
*G02F 1/1368* (2006.01)
*G09G 3/36* (2006.01)
*H01L 27/12* (2006.01)
*G02F 1/1333* (2006.01)

(52) U.S. Cl.
CPC ....... G09G 3/3674 (2013.01); H01L 27/1218 (2013.01); *G02F 1/133305* (2013.01); *G02F 1/133345* (2013.01); *G09G 2300/0408* (2013.01)

(56) References Cited

U.S. PATENT DOCUMENTS

| | | |
|---|---|---|
| 2005/0162070 A1 | 7/2005 | Park |
| 2007/0257260 A1* | 11/2007 | Liu .................. H01L 29/78696 257/59 |
| 2013/0119371 A1 | 5/2013 | Chiu et al. |
| 2013/0328069 A1 | 12/2013 | Yang et al. |
| 2019/0123209 A1 | 4/2019 | Zeng et al. |
| 2020/0193932 A1 | 6/2020 | Liu et al. |

FOREIGN PATENT DOCUMENTS

| | | | | |
|---|---|---|---|---|
| CN | 102856391 A | | 1/2013 | |
| CN | 107204375 A | | 9/2017 | |
| CN | 107452810 A | * | 12/2017 | ....... H01L 29/78696 |
| CN | 109309100 A | | 2/2019 | |

* cited by examiner

THIN FILM TRANSISTOR STRUCTURE, GOA CIRCUIT, AND DISPLAY DEVICE

CROSS REFERENCE TO RELATED APPLICATION

This application claims priority to a Chinese patent application filed with the China National Intellectual Property Administration on Nov. 1, 2019, with an application number of 201911060470.6, and a disclosure name is "THIN FILM TRANSISTOR STRUCTURE, GOA CIRCUIT, AND DISPLAY DEVICE", an entire contents of which are incorporated herein by reference.

FIELD OF DISCLOSURE

The present disclosure relates to displays, and more particularly to a thin film transistor structure, a gate-driver-on-array (GOA) circuit, and a display device.

BACKGROUND OF DISCLOSURE

More and more existing liquid crystal displays (LCDs) are using gate-driver-on-array (GOA), that is, to directly fabricate thin film transistors (TFTs) on an array substrate, thereby eliminating space occupied by a bonding area and a fan-out area of integrated circuits (ICs). Cost of materials and preparation processes can be reduced, and the borders on both sides of the gate lines of the panel are reduced.

In the GOA circuit, a plurality of TFTs having a large channel width are required, and the channel width is usually between 500 and 10,000 microns. In this case, when a defect occurs in the gate insulating layer and a leakage path is formed, function of the TFTs is disabled, and the GOA circuit cannot be operated.

Therefore, it is necessary to provide a thin film transistor structure, a GOA circuit, and a display device to solve the problems existing in the prior art.

SUMMARY OF DISCLOSURE

From above, the present disclosure provides a thin film transistor structure, a gate-driver-on-array (GOA) circuit, and a display device, so as to solve the problem that, when a defect occurs in the gate insulating layer and a leakage path is formed, function of the thin film transistor structure is disabled, and the GOA circuit cannot be operated.

An object of the present disclosure is to provide a thin film transistor structure, which can avoid function failure of the whole thin film transistor structure when a defect occurs in the gate insulating layer and a leakage path is formed.

Another object of the present disclosure is to provide a GOA circuit with the above thin film transistor structure, which can avoid function failure of the whole thin film transistor structure when a defect occurs in the gate insulating layer and a leakage path is formed.

A further object of the present disclosure is to provide a display device with the above GOA circuit, which can avoid function failure of the whole thin film transistor structure when a defect occurs in the gate insulating layer and a leakage path is formed.

To achieve the above object of the present disclosure, an embodiment of the present disclosure provides a thin film transistor structure comprising a gate layer, a gate insulating layer, an active layer, a comb-shaped source, and a comb-shaped drain. The gate layer comprises a plurality of gate patterns. The gate insulating layer covers the gate layer. The active layer is disposed on the gate insulating layer, wherein the active layer comprises a plurality of active patterns, and positions of the plurality of active patterns are respectively aligned with positions of the plurality of gate patterns. The comb-shaped source is disposed on the active layer and comprises a plurality of source comb tooth portions and a source comb handle portion, wherein the plurality of source comb tooth portions are connected to the source comb handle portion. The comb-shaped drain is disposed on the active layer and comprises a plurality of drain comb tooth portions and a drain comb handle portion, wherein the plurality of drain comb tooth portions are connected to the drain comb handle portion, wherein the plurality of source comb tooth portions and the plurality of drain comb tooth portions are arranged alternately on the active layer in a direction, and the plurality of active patterns are each provided with one of the plurality of source comb tooth portions and one of the plurality of drain comb tooth portions.

In an embodiment of the present disclosure, the plurality of source comb tooth portions are parallel to each other.

In an embodiment of the present disclosure, the plurality of drain comb tooth portions are parallel to each other.

In an embodiment of the present disclosure, the gate insulating layer comprises a plurality of gate insulating patterns, and the plurality of active patterns are respectively disposed on the plurality of gate insulating patterns.

In an embodiment of the present disclosure, width of the active layer along the direction is between 500 and 10,000 micrometers.

In an embodiment of the present disclosure, width of each of the plurality of active patterns along the direction is between 10 and 150 micrometers.

In an embodiment of the present disclosure, the comb-shaped source is electrically insulated from the comb-shaped drain.

Further, another embodiment of the present disclosure provides a gate-driver-on-array (GOA) circuit comprising a thin film transistor structure according to any one of the above embodiments.

In an embodiment of the present disclosure, the plurality of source comb tooth portions are parallel to each other.

In an embodiment of the present disclosure, the plurality of drain comb tooth portions are parallel to each other.

In an embodiment of the present disclosure, the gate insulating layer comprises a plurality of gate insulating patterns, and the plurality of active patterns are respectively disposed on the plurality of gate insulating patterns.

In an embodiment of the present disclosure, width of the active layer along the direction is between 500 and 10,000 micrometers.

In an embodiment of the present disclosure, width of each of the plurality of active patterns along the direction is between 10 and 150 micrometers.

In an embodiment of the present disclosure, the comb-shaped source is electrically insulated from the comb-shaped drain.

Further, a further embodiment of the present disclosure provides a display device comprising a substrate; and a gate-driver-on-array (GOA) circuit according to any one of the above embodiments, wherein the GOA circuit is disposed on the substrate.

In an embodiment of the present disclosure, the substrate comprises at least one of a flexible substrate, a transparent substrate, and a flexible transparent substrate.

In an embodiment of the present disclosure, the plurality of source comb tooth portions are parallel to each other, and the plurality of drain comb tooth portions are parallel to each other.

In an embodiment of the present disclosure, the gate insulating layer comprises a plurality of gate insulating patterns, and the plurality of active patterns are respectively disposed on the plurality of gate insulating patterns.

In an embodiment of the present disclosure, width of the active layer along the direction is between 500 and 10,000 micrometers, and width of each of the plurality of active patterns along the direction is between 10 and 150 micrometers.

In an embodiment of the present disclosure, the comb-shaped source is electrically insulated from the comb-shaped drain.

Compared with the conventional technologies, in the thin film transistor structure, the GOA circuit, and the display device of the present disclosure, the plurality of active patterns are each provided with one of the plurality of source comb tooth portions and one of the plurality of drain comb tooth portions, such that the thin film transistor structure forms a plurality of thin film transistors in a parallel state. Therefore, when a defect appears in the gate insulating layer of one of the plurality of thin film transistors and a leakage path is formed, other thin film transistors will not be affected. Therefore, a problem of functional failure of a whole thin film transistor structure can be avoided.

To make the above description of the present disclosure more clearly comprehensible, it is described in detail below in examples of preferred embodiments with the accompanying drawings.

DETAILED DESCRIPTION OF PREFERRED EMBODIMENTS

Following description of the various embodiments is provided to illustrate the specific embodiments of the present disclosure. Furthermore, directional terms mentioned in the present disclosure, such as upper, lower, top, bottom, front, rear, left, right, inner, outer, side, surrounding, central, horizontal, horizontal, vertical, longitudinal, axial, radial, an uppermost layer or a lowermost layer, etc., only refer to a direction of the accompanying figures. Therefore, the used directional terms are used to describe and understand the present disclosure, but the present disclosure is not limited thereto.

Figure 1A:
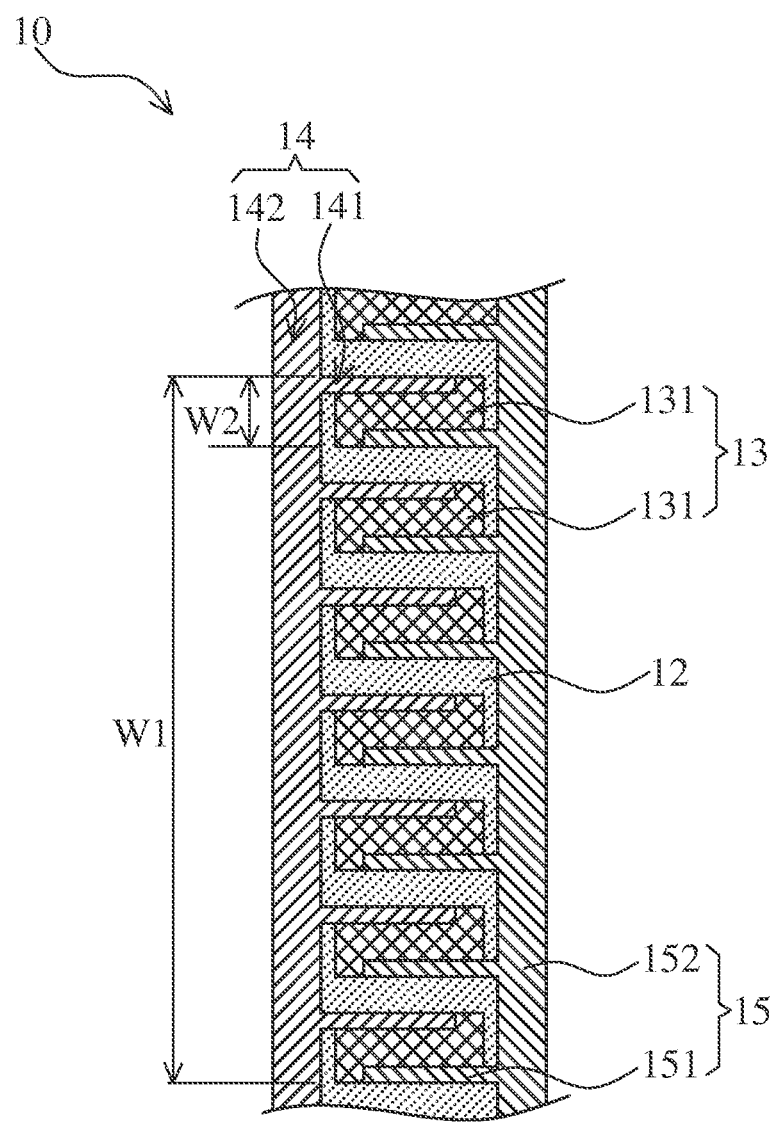
FIG. 1A is a schematic top view of a thin film transistor structure according to an embodiment of the present disclosure.
Figure 1B:
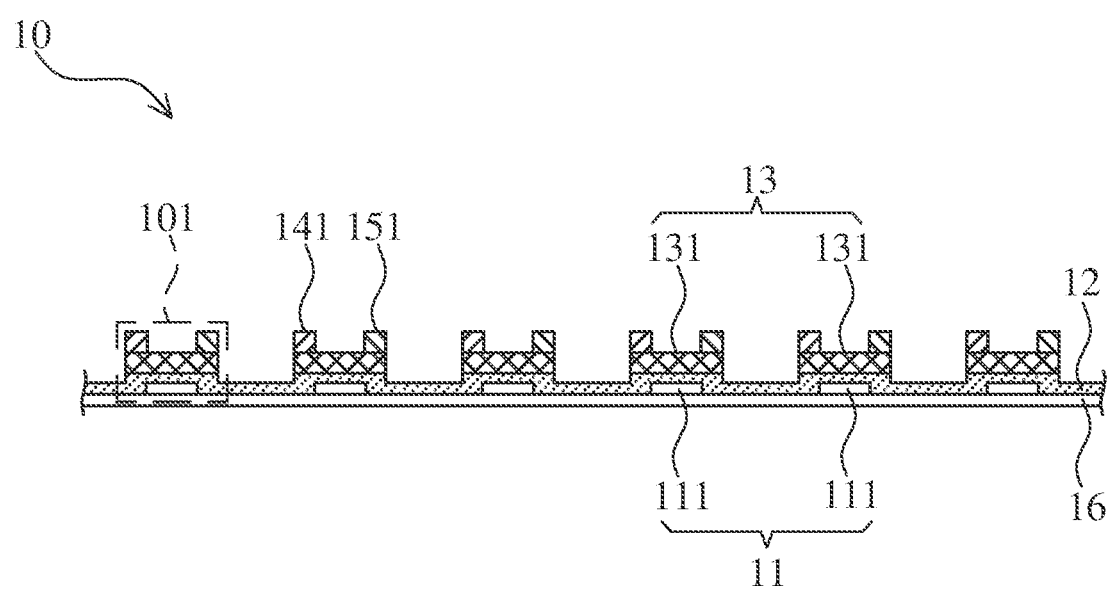
FIG. 1B is a schematic cross-sectional view of a thin film transistor structure according to an embodiment of the present disclosure.

Referring to FIG. 1A and FIG. 1B, in an embodiment of the present disclosure, a thin film transistor structure 10 comprises a gate layer 11, a gate insulating layer 12, an active layer 13, a comb-shaped source 14, and a comb-shaped drain 15. In an embodiment, the thin film transistor structure 10 is disposed on a substrate 16, for example. In an example, the gate layer 11, the gate insulating layer 12, the active layer 13, the comb-shaped source, 14 and the comb-shaped drain 15 are sequentially disposed on the substrate 16. In another embodiment, the substrate 16 includes, for example, at least one of a flexible substrate, a transparent substrate, and a flexible transparent substrate. The thin film transistor structure 10 can include a plurality of thin film transistors 101.

In an embodiment of the present disclosure, the gate layer 11 of the thin film transistor structure 10 includes a plurality of gate patterns 111, wherein each of the plurality of gate patterns serves as a gate of a thin film transistor 101. In one embodiment, the gate layer 11 can be formed on the substrate 16 by an existing semiconductor process (such as deposition or sputtering). In another embodiment, material of the gate layer 11 can be a conductive material.

In an embodiment of the present disclosure, the gate insulating layer 12 of the thin film transistor structure 10 covers the gate layer 11. In one embodiment, the gate insulating layer 12 can cover the gate layer 11 by an existing semiconductor process (such as deposition). In another embodiment, material of the gate insulating layer 12 can be a known insulating material.

In an embodiment of the present disclosure, the active layer 13 of the thin film transistor structure 10 is disposed on the gate insulating layer 12. The active layer 13 includes a plurality of active patterns 131, and positions of the plurality of active patterns 131 are aligned with positions of the plurality of gate patterns 111, respectively. In one embodiment, the plurality of gate patterns 111 are respectively aligned with the plurality of active patterns 131 and are located below the plurality of active patterns 131. Specifically, the plurality of active patterns 131 are mainly used as channel regions of the plurality of thin film transistors 101. In another embodiment, the active layer 13 can be formed on the gate insulating layer 12 through an existing semiconductor process (such as deposition or sputtering). In an embodiment, a width W1 of the active layer along the direction is between 500 and 10,000 micrometers. In an example, the width W1 is, for example, 600, 700, 800, 1,000, 1,200, 1,500, 1,800, 2,000, 2,200, 2,500, 2,700, 2,900, 3,000, 3,500, 4,000, 5,000, 6,000, 7,000, 8,000, 9,000, 9,500, 9,600, 9,700, 9,800, or 9,900 micrometers. In an embodiment, a width W2 of each of the plurality of active patterns along the direction X is between 10 and 150 micrometers. In an example, the width W2 is, for example, 20, 30, 40, 50, 70, 90, 100, 110, 130, or 140 micrometers.

In an embodiment of the present disclosure, the comb-shaped source 14 of the thin film transistor structure 10 is disposed on the active layer 13 and includes a plurality of source comb tooth portions 141 and a source comb handle portion 142, wherein the plurality of source comb tooth portions 141 are connected to the source comb handle portion 142. In an embodiment, the plurality of source comb tooth portions 141 are not directly interconnected with each other, but are indirectly connected through the source comb handle portion 142. In another embodiment, the plurality of source comb tooth portions 141 are parallel to each other. In another embodiment, the plurality of source comb tooth portions 141 and a source comb handle portion 142 may be formed by, for example, firstly covering a conductive material layer on the active layer 13 and then patterning the conductive material layer, so as to form the plurality of source comb tooth portions 141 and the source comb handle portion 142. The plurality of source comb tooth portions 141 are mainly used as sources of the plurality of thin film transistors 101.

In an embodiment of the present disclosure, the comb-shaped drain 15 of the thin film transistor structure 10 is disposed on the active layer 13 and includes a plurality of drain comb tooth portions 151 and a drain comb handle portion 152, wherein the plurality of drain comb tooth portions 151 are connected to the drain comb handle portion 152. In an embodiment, the plurality of drain comb tooth portions 151 are not directly interconnected with each other, but are indirectly connected through the drain comb handle portion 152. In another embodiment, the plurality of drain comb tooth portions 151 are parallel to each other. In another embodiment, the plurality of drain comb tooth portions 151 and a drain comb handle portion 152 may be formed by, for example, first covering a conductive material layer on the active layer 13 and then further patterning the conductive layer 13, so as to form the plurality of drain comb tooth portions 151 and the drain comb handle portion 152. In another embodiment, the plurality of source comb tooth portions 141, the source comb handle portion 142, the plurality of drain comb tooth portions 151, and the drain comb handle portion 152 may be formed together or separately in a patterning process. In a further embodiment, the comb-shaped source 14 is electrically insulated from the comb-shaped drain 15. In still another embodiment, the plurality of drain comb handles 152 are mainly used as drains of the plurality of thin film transistors 101.

In the thin film transistor structure 10 according to an embodiment of the present disclosure, the plurality of source comb tooth portions 141 and the plurality of drain comb tooth portions 151 are arranged alternately on the active layer 13 in a direction. For example, the drain comb tooth portion 151 is disposed between two adjacent source comb tooth portions 141, or the source comb tooth portion 141 is disposed between two adjacent drain comb tooth portions 151.

In the thin film transistor structure 10 according to an embodiment of the present disclosure, the plurality of active patterns 131 are each provided with one of the plurality of source comb tooth portions 141 and one of the plurality of drain comb tooth portions 151. In other words, each of the active patterns 131 defines a region of a thin film transistor 101, and each of the active patterns 131 is not connected to each other. Therefore, even if a defect occurs in the gate insulating layer 12 of one of the plurality of thin film transistors 101 and a leakage path is formed, other thin film transistors 101 are not affected, such that the problem of functional failure of the whole thin film transistor structure can be avoided. Specifically, for example, the thin film transistor structure 10 of the present disclosure defines twenty thin film transistors 101, and an output current is 100%. If one of the thin film transistors 101 fails to operate (for example, based on the above-mentioned defects, etc.), the whole output current is decreased to be 95%, but it does not invalidate the function of the whole thin film transistor structure.

Figure 2A:
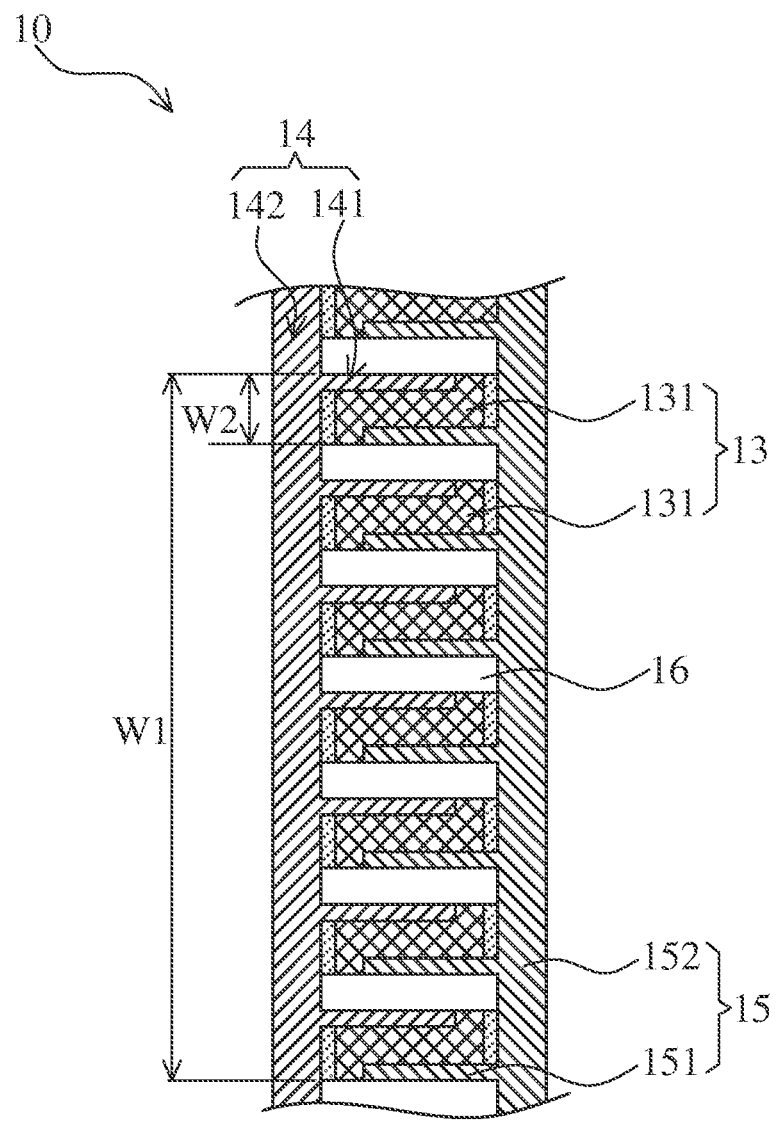
FIG. 2A is a schematic top view of a thin film transistor structure according to another embodiment of the present disclosure.
Figure 2B:
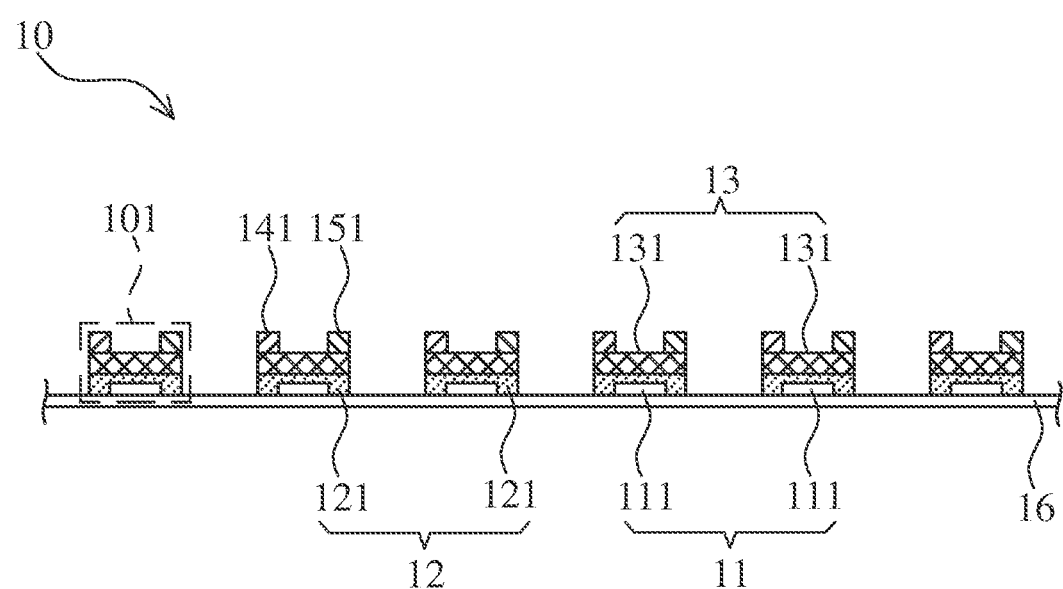
FIG. 2B is a schematic cross-sectional view of a thin film transistor structure according to another embodiment of the present disclosure.

In an embodiment, please refer to FIG. 2A and FIG. 2B. The gate insulating layer 12 includes a plurality of gate insulating patterns 121, and the plurality of active patterns 131 are respectively disposed on the plurality of gate insulating patterns 121. In an example, the plurality of gate insulating patterns 121 are aligned with the plurality of active patterns 131, respectively, and are located below the plurality of active patterns 131. In this embodiment, because a plurality of gate insulating patterns 121 are formed by patterning the gate insulating layer 12, the plurality of gate insulating patterns 121 are not connected to each other. In other words, each of the gate insulating patterns 121 defines a region of a thin film transistor 101. Therefore, even if a defect occurs in the gate insulating pattern 121 of one of the plurality of thin film transistors 101 and a leakage path is formed, other thin film transistors 101 will not be affected, such that the problem of functional failure of the whole thin film transistor structure can be avoided. In addition, since the gate insulating layer 12 is patterned in this embodiment, the characteristic of parallel connection between the plurality of thin film transistors 101 can be further ensured.

An embodiment of the present disclosure further provides a GOA circuit, which includes the thin film transistor structure 10 according to any one of the above embodiments.

An embodiment of the present disclosure further provides a display device including a substrate 16; and a GOA circuit according to any of the above embodiments, wherein the GOA circuit is disposed on the substrate 16. In one embodiment, the substrate 16 includes at least one of a flexible substrate, a transparent substrate, and a flexible transparent substrate.

The present disclosure has been described in relative embodiments described above, but the above embodiments are merely examples for implementing the present disclosure. It is noted that the disclosed embodiments do not limit the scope of the disclosure. On the contrary, modifications and equal settings included in the spirit and scope of the claims are all included in the scope of the present disclosure.

The invention claimed is:
1. A thin film transistor structure, comprising:
a gate layer comprising a plurality of gate patterns;
a gate insulating layer covering the gate layer;
an active layer disposed on the gate insulating layer, wherein the active layer comprises a plurality of active patterns, and positions of the plurality of active patterns are respectively aligned with positions of the plurality of gate patterns;
a comb-shaped source disposed on the active layer and comprising a plurality of source comb tooth portions and a source comb handle portion, wherein the plurality of source comb tooth portions are connected to the source comb handle portion; and
a comb-shaped drain disposed on the active layer and comprising a plurality of drain comb tooth portions and a drain comb handle portion, wherein the plurality of drain comb tooth portions are connected to the drain comb handle portion, wherein the plurality of source comb tooth portions and the plurality of drain comb tooth portions are arranged alternately on the active layer in a direction, and the plurality of active patterns are each provided with a corresponding one of the plurality of source comb tooth portions and a corresponding one of the plurality of drain comb tooth portions;
wherein each of the plurality of active patterns is located only between one of two adjacent of the plurality of source comb tooth portions and one of the plurality of drain comb tooth portions located between the two adjacent of the plurality of source comb tooth portions, and there is no active pattern between the other one of the two adjacent of the plurality of source comb tooth portions and the one of the plurality of drain comb tooth portions located between the two adjacent of the plurality of source comb tooth portions.

2. The thin film transistor structure according to claim 1, wherein the plurality of source comb tooth portions are parallel to each other.

3. The thin film transistor structure according to claim 1, wherein the plurality of drain comb tooth portions are parallel to each other.

4. The thin film transistor structure according to claim 1, wherein the gate insulating layer comprises a plurality of gate insulating patterns, and the plurality of active patterns are respectively disposed on the plurality of gate insulating patterns.

5. The thin film transistor structure according to claim 1, wherein a width of the active layer along the direction is between 500 and 10,000 micrometers.

6. The thin film transistor structure according to claim 5, wherein a width of each of the plurality of active patterns along the direction is between 10 and 150 micrometers.

7. The thin film transistor structure according to claim 1, wherein the comb-shaped source is not electrically connected to the comb-shaped drain.

8. A gate-driver-on-array (GOA) circuit, comprising the thin film transistor structure according to claim 1.

9. The GOA circuit according to claim 8, wherein the plurality of source comb tooth portions are parallel to each other.

10. The GOA circuit according to claim 8, wherein the plurality of drain comb tooth portions are parallel to each other.

11. The GOA circuit according to claim 8, wherein the gate insulating layer comprises a plurality of gate insulating patterns, and the plurality of active patterns are respectively disposed on the plurality of gate insulating patterns.

12. The GOA circuit according to claim 8, wherein a width of the active layer along the direction is between 500 and 10,000 micrometers.

13. The GOA circuit according to claim 12, wherein a width of each of the plurality of active patterns along the direction is between 10 and 150 micrometers.

14. The GOA circuit according to claim 8, wherein the comb-shaped source is not electrically connected to the comb-shaped drain.

15. A display device, comprising:
a substrate; and
the gate-driver-on-array (GOA) circuit according to claim 8, wherein the GOA circuit is disposed on the substrate.

16. The display device according to claim 15, wherein the substrate comprises at least one of a flexible substrate, a transparent substrate, and a flexible transparent substrate.

17. The display device according to claim 15, wherein the plurality of source comb tooth portions are parallel to each other, and the plurality of drain comb tooth portions are parallel to each other.

18. The display device according to claim 15, wherein the gate insulating layer comprises a plurality of gate insulating patterns, and the plurality of active patterns are respectively disposed on the plurality of gate insulating patterns.

19. The display device according to claim 15, wherein a width of the active layer along the direction is between 500 and 10,000 micrometers, and a width of each of the plurality of active patterns along the direction is between 10 and 150 micrometers.

20. The display device according to claim 15, wherein the comb-shaped source is not electrically connected to the comb-shaped drain.

* * * * *